(12) United States Patent
Tamura et al.

(10) Patent No.: US 10,310,010 B2
(45) Date of Patent: Jun. 4, 2019

(54) PROBE APPARATUS AND PROBE METHOD

(71) Applicants: TOKYO ELECTRON LIMITED, Tokyo (JP); SEIWA OPTICAL CO., LTD., Tokyo (JP)

(72) Inventors: Muneaki Tamura, Yamanashi (JP); Shinji Akaike, Yamanashi (JP); Kenta Saiki, Yamanashi (JP); Kazuhiko Koshimizu, Beaverton, OR (US); Isao Okazaki, Tokyo (JP); Mitsuya Kawatsuki, Tokyo (JP); Kiyoshi Tsuda, Tokyo (JP)

(73) Assignees: TOKYO ELECTRON LIMITED, Tokyo (JP); SEIWA OPTICAL CO., LTD., Tokyo (JP)

(*) Notice: Subject to any disclaimer, the term of this patent is extended or adjusted under 35 U.S.C. 154(b) by 484 days.

(21) Appl. No.: 14/957,459

(22) Filed: Dec. 2, 2015

(65) Prior Publication Data

US 2016/0161553 A1 Jun. 9, 2016

(30) Foreign Application Priority Data

Dec. 5, 2014 (JP) ................. 2014-246670

(51) Int. Cl.
*G01R 31/02* (2006.01)
*G01R 31/28* (2006.01)
(Continued)

(52) U.S. Cl.
CPC ...... *G01R 31/2891* (2013.01); *G01R 31/2887* (2013.01)

(58) Field of Classification Search
CPC .... G01R 31/02; G01R 31/28; G01R 31/2886; G01R 31/2887; G01R 31/2891; G01R 1/06794; G01R 1/067; G01R 35/00
See application file for complete search history.

(56) References Cited

U.S. PATENT DOCUMENTS 4,975,573 A * 12/1990 Girard .................... G01M 11/04
250/252.1
5,585,738 A * 12/1996 Kuji ................... G01R 1/07314
324/690

(Continued)

FOREIGN PATENT DOCUMENTS

JP H07-297241 11/1995
JP H08-335612 12/1996
(Continued)

*Primary Examiner* — Neel D Shah (57) ABSTRACT

A probe apparatus includes a stage, a first and a second imaging device, a first and a second imaging optical unit, and a projection optical unit. The stage is movable in horizontal and vertical directions. The first imaging device picks up an image of a probe needle which is made to contact with an electrode of a device formed on a surface of the substrate. The first and second imaging optical units include optical systems for performing an image pickup by using the first and second imaging devices, respectively. The second imaging device picks up an image of the electrode held on the stage. The projection optical unit includes an optical system that projects an optical target mark, used in a position alignment of the first and the second imaging device, onto each of image forming units of the first and second imaging devices at the same time.

5 Claims, 10 Drawing Sheets

(51) Int. Cl.
*G01R 1/067* (2006.01)
*G01R 35/00* (2006.01)

(56) References Cited

U.S. PATENT DOCUMENTS

| | | | |
|---|---|---|---|
| 5,640,101 A | 6/1997 | Kuji et al. | |
| 6,710,798 B1 * | 3/2004 | Hershel | G01R 31/2887 348/87 |
| 2003/0142861 A1 * | 7/2003 | Penkethman | G01R 31/2891 382/151 |
| 2007/0176612 A1 * | 8/2007 | Sakata | G01R 31/2891 324/750.16 |
| 2007/0229098 A1 * | 10/2007 | Kobayashi | G01R 31/2891 324/750.23 |
| 2008/0238463 A1 * | 10/2008 | Takabe | G01R 31/2891 324/762.06 |
| 2009/0195263 A1 * | 8/2009 | Yano | G01R 31/2891 324/762.06 |
| 2014/0117239 A1 * | 5/2014 | Sakai | G01J 3/06 250/339.02 |

FOREIGN PATENT DOCUMENTS

| | | |
|---|---|---|
| JP | 2003-279311 A | 10/2003 |
| JP | 2003-303865 | 10/2003 |
| JP | 2010-219110 | 9/2010 |

* cited by examiner

PROBE APPARATUS AND PROBE METHOD

CROSS-REFERENCE TO RELATED APPLICATIONS

This application claims priority to Japanese Patent Application No. 2014-246670 filed on Dec. 5, 2014, the entire contents of which are incorporated herein by reference.

FIELD OF THE INVENTION

The disclosure relates to a probe apparatus and a probe method which are used in a test of a substrate such as a semiconductor wafer or the like.

BACKGROUND OF THE INVENTION

In a manufacturing process of a semiconductor device, a probe test is performed to evaluate an electrical characteristic of the semiconductor device. The probe test is performed by making probe needles contact with electrodes of semiconductor devices formed on a semiconductor substrate, inputting electric signals to each of the semiconductor devices, and observing electric signals outputted in response to the input signals, thereby evaluating electrical characteristics of the semiconductor devices.

A probe apparatus used in the probe test includes: a stage that holds a substrate on which a semiconductor device to be tested is formed, the stage being rotatable and movable in horizontal and vertical directions; and an alignment device for making probe needles exactly contact with electrodes of the semiconductor device formed on the substrate. As the alignment device, there is suggested one having a first camera for detecting the positions of the probe needles and a second camera for detecting the position of the semiconductor device formed on a surface of the substrate (see, e.g., Japanese Patent Application Publication Nos. H8-335612 and H7-297241). In the probe apparatus, in order to perform a position alignment between the probe needles and the electrodes, the following process is performed: a process of obtaining as coordinates the positions of the probe needles by using the first camera; a process of aligning the positions of the first and second cameras by a movable mechanical target; and a process of obtaining as coordinates the positions of the electrodes on the substrate by using the second camera.

As in the above references, in a method of performing a position alignment of a pair of cameras by using the mechanical target, there is required an operation of moving the target back and forth toward the vicinity of the focuses of the first and second cameras. For this reason, there is concerned that a failure may occur due to a contact of the mechanical target with another member of the probe apparatus by malfunction and particles may be generated from a driving mechanism of the mechanical target. Further, since the driving mechanism of the mechanical target is complicated, there arise problems that the number of the components is large, miniaturization is difficult, the cost is high, and a regular maintenance is required. Furthermore, in the mechanical target, since a glass plate having a target mark formed thereon is used, the amount of the refraction is changed depending on the thickness of the glass plate. As a result, from one of the cameras, an error occurs in a thickness direction of the glass plate. Therefore, there arises a problem of degrading an accuracy of the position alignment.

Instead of the mechanical target, a method is known in which the positions of a pair of cameras are aligned by using an optical unit (see, e.g., Japanese Patent Application Publication Nos. 2003-303865 and 2010-219110). In Japanese Patent Application Publication No. 2003-303865, there is suggested a probe apparatus that performs a position alignment by allowing a spot light to proceed along an optical axis of one of the cameras and to be recognized by the other camera. In Japanese Patent Application Publication No. 2010-219110, there is suggested a probe apparatus including a projection optical system that projects a two-dimensional pattern from one of the cameras toward the other of the cameras.

In Japanese Patent Application Publication Nos. 2003-303865 and 2010-219110 which perform the position alignment of a pair of cameras by using the optical unit, when performing the position alignment, the both cameras cannot simultaneously recognize the spot light or the two-dimensional pattern which serves as a substitute of the target mark. For this reason, in the conventional technologies, the position alignment needs to be performed in plural steps. As a result, more effort and time is required for the position alignment, and thus a throughput is lowered in the entire probe test.

Further, in the position alignment methods of Japanese Patent Application Publication Nos. 2003-303865 and 2010-219110, since the spot light or the two-dimensional pattern cannot be recognized by the both camera at the same time, there is required an operation for recognizing the spot light or the two-dimensional pattern by inserting an opaque object onto an optical axis of any one of the cameras. Accordingly, in the position alignment methods of Japanese Patent Application Publication Nos. 2003-303865 and 2010-219110, a movable member is used, so that most of the above problems occurring in the methods of employing the conventional mechanical target remains not solved.

For example, in the probe apparatus disclosed in Japanese Patent Application Publication No. 2003-303865, in a camera placed in an irradiating side of the spot light, the position alignment between an optical axis of the camera and the spot light becomes impossible until the spot light is imaged on a surface of an object that blocks an optical axis of the spot light. In the probe apparatus disclosed in Japanese Patent Application Publication No. 2010-219110, since the two-dimensional pattern cannot be recognized directly by a camera placed near the projection optical system, it is required to previously pick up a real image of the two-dimensional pattern by inserting an object such as an opaque plate or the like so as to block light from the camera, and store its coordinates.

SUMMARY OF THE INVENTION

In view of the above, the disclosure provides a probe apparatus capable of performing a position alignment of a pair of cameras in a short period of time by using an optical unit instead of a mechanical target.

In accordance with an aspect, there is provided a probe apparatus including: a stage configured to hold a substrate and to be movable in horizontal and vertical directions; a first imaging device configured to pick up an image of a probe needle which is made to contact with an electrode of a device formed on a surface of the substrate; a first imaging optical unit including an optical system for performing an image pickup by using the first imaging device; a second imaging device configured to pick up an image of the electrode in a state where the substrate is held on the stage;

a second imaging optical unit including an optical system for performing an image pickup by using the second imaging device; and a projection optical unit including an optical system that projects an optical target mark, used in a position alignment of the first and the second imaging device, onto each of image forming units of the first and the second imaging device at the same time.

In accordance with another aspect, there is provided a probe method using the above probe apparatus. The probe method includes: projecting the target mark onto each of the image forming units of the first and the second imaging device at the same time, and performing a position alignment of the first and the second imaging device based on image data of the target mark; picking up images of a plurality of electrodes of the substrate by using the second imaging device and storing position coordinates of the electrodes at that time; picking up an image of the probe needle by using the first imaging device and storing position coordinates of the probe needle at that time; and making the probe needle contact with a corresponding one of the electrodes based on the position coordinates of the electrodes and the position coordinates of the probe needle, and inspecting an electrical characteristic of the device formed on the surface of the substrate.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
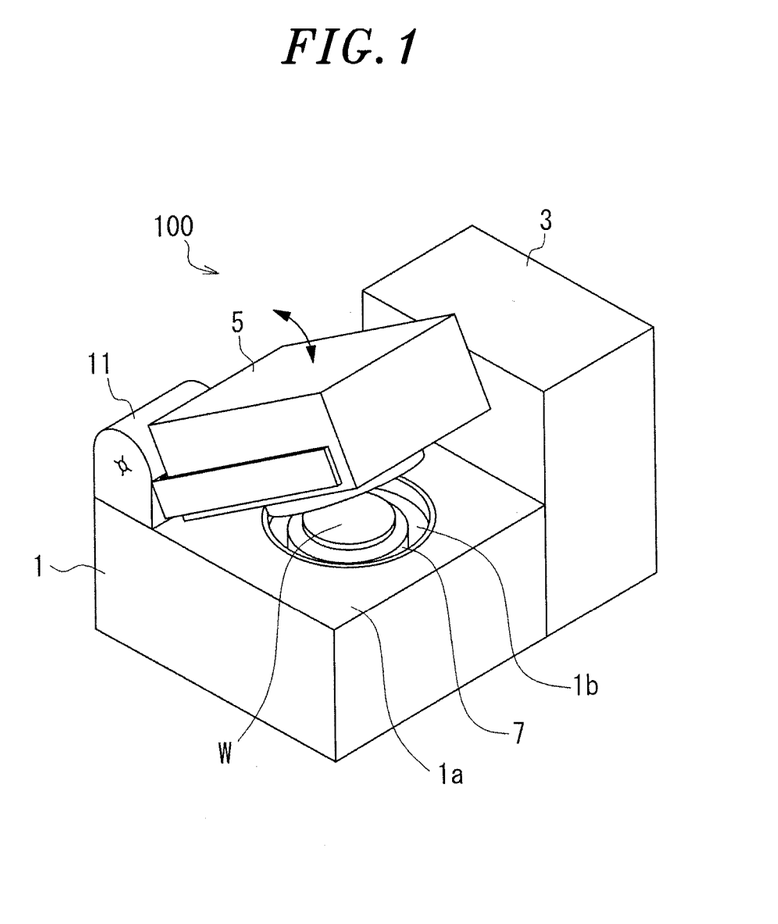
FIG. 1 is a perspective view showing an external configuration of a probe apparatus in accordance with an embodiment.
Figure 2:
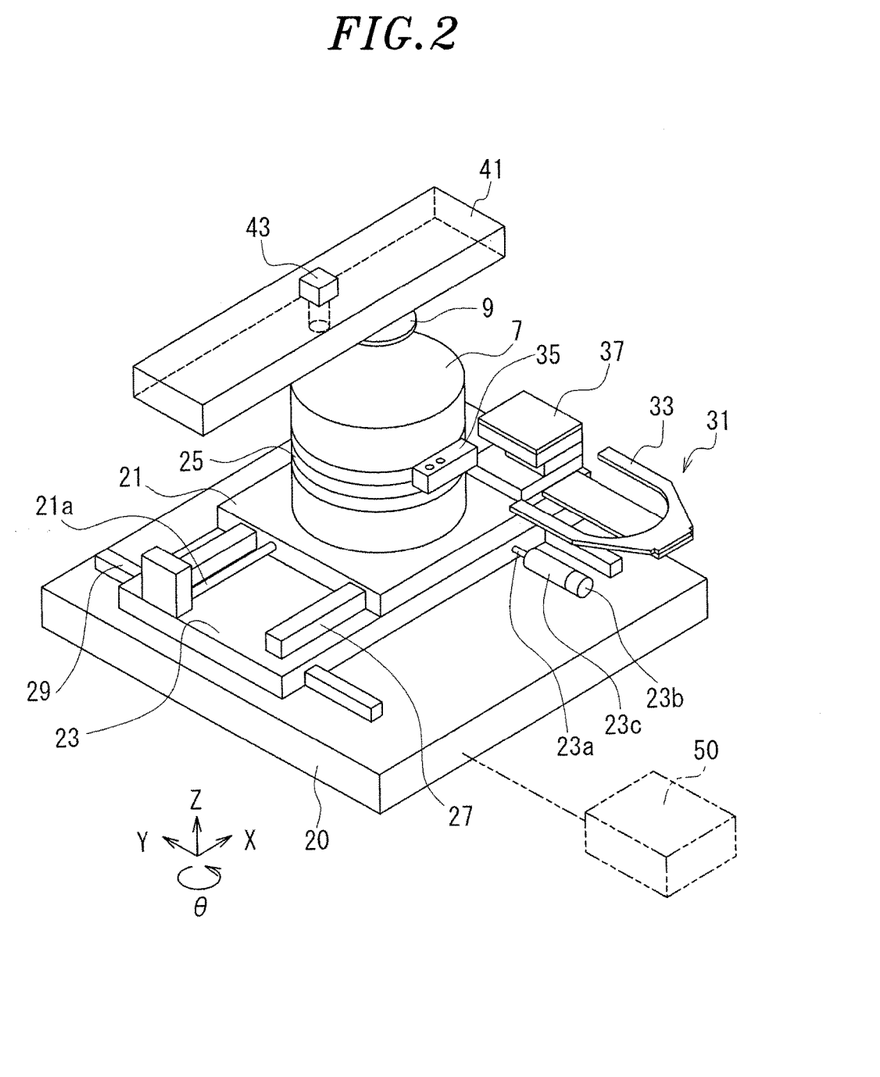
FIG. 2 is a perspective view schematically showing an internal structure of the probe apparatus shown in FIG. 1.

Hereinafter, embodiments of the present invention will be described in detail with respect to the accompanying drawings. FIG. 1 is a perspective view showing an external configuration of a probe apparatus 100 in accordance with an embodiment of the present invention. FIG. 2 is a perspective view schematically showing an internal structure of the probe apparatus 100 shown in FIG. 1.

The probe apparatus 100 of the present embodiment performs a test on an electrical characteristic of a device (not shown) such as a semiconductor device formed on a semiconductor wafer (hereinafter, simply referred to as "wafer") W. The probe apparatus 100 includes a main body 1, a loader unit 3 arranged adjacent to the main body 1, and a test head 5 arranged to cover the main body 1.

(Main Body)

The main body 1 is a hollow case and accommodates a stage 7 on which a wafer W is mounted. An opening 1b is formed at a ceiling portion 1a of the main body 1. The opening 1b is positioned above the wafer W mounted on the stage 7. A substantially disc-shaped probe card holder (not shown) which holds a disc-shaped probe card 9 is fitted in the opening 1b. The probe card 9 is arranged opposite to the wafer W mounted on the stage 7 by the probe card holder.

(Loader Unit)

The loader unit 3 transfers a wafer W accommodated in a FOUP (not shown), which is a transfer container, to the stage 7 of the main body 1. Further, the loader unit 3 receives a wafer W that has been subjected to the electrical characteristic test of its device, and the loader unit 3 accommodates the wafer W to the FOUP.

(Test Head)

The test head 5 has a rectangular parallelepiped shape and is pivotable in an up-down direction by a hinge mechanism 11 provided at the main body 1. The test head 5 is electrically connected to the probe card 9 through a contact ring (not shown) in a state where the main body 1 is covered from above by the test head 5. The test head 5 stores, as measured data, an electric signal indicating an electrical characteristic of the device transmitted from the probe card 9 and determines whether or not the device has an electric fault based on the measured data.

(Stage)

As shown in FIG. 2, the stage 7 is arranged on a base 20 and includes an X-direction moving unit 21 which moves in an X direction shown in FIG. 2, a Y-direction moving unit 23 which moves in a Y direction shown in FIG. 2, and a Z-direction moving unit 25 which moves in a Z direction shown in FIG. 2.

The X-direction moving unit 21 precisely moves the stage 7 in the X direction along a guide rail 27 arranged in the X direction by a rotation of a ball screw 21a. The ball screw 21a is rotated by a motor (not shown). The movement amount of the stage 7 is detected by an encoder (not shown) included in the motor.

The Y-direction moving unit 23 precisely moves the stage 7 in the Y direction along a guide rail 29 arranged in the Y direction by a rotation of a ball screw 23a. The ball screw 23a is rotated by a motor 23b. The movement amount of the stage 7 is detected by an encoder 23c included in the motor 23b.

As such, the X-direction moving unit 21 and the Y-direction moving unit 23 move on a horizontal plane the stage 7 in X and Y directions which are perpendicular to each other.

The Z-direction moving unit 25 has a motor (not shown) and an encoder (not shown). The Z-direction moving unit 25 moves the stage 7 up and down along the Z direction and detects the movement amount of the stage 7. The Z-direction moving unit 25 moves the stage 7 toward the probe card 9 to make electrodes of the device on the wafer W contact with probe needles. The stage 7 is arranged to be rotatable, on the Z-direction moving unit 25, in a θ direction shown in FIG. 2 by the motor (not shown).

(Probe Card)

The probe card 9 includes a plurality of probe needles 9a (see FIGS. 10 and 11) on a surface facing the stage 7. In the probe apparatus 100, the relative positions of the probe card 9 and the wafer W are controlled and the electrodes of the device are made to contact with the probe needles 9a, by allowing the stage 7 to move in the horizontal direction (X, Y and θ directions) and the vertical direction (Z direction). The test head 5 sends a test current to the device through the probe needles 9a of the probe card 9. The probe card 9 transmits an electric signal indicating an electrical characteristic of the device to the test head 5. The test head 5 stores the transmitted electric signal as measured data and determines whether the device that is a test target has an electric fault or not. The probe needles 9a may have any shapes as long as they can be connected to the electrodes of the device.

In the main body 1, a probe card holder exchange unit is provided adjacent to the stage 7. The probe card holder exchange unit 31 has a fork 33 for supporting a probe card holder (not shown) that holds the probe card 9. The fork 33 is movable in Y and Z directions and carries out the exchange of the probe card 9.

(Lower Imaging Unit)

In the main body 1, a lower imaging unit 35 and a needle tip polishing unit 37 are arranged between the stage 7 and the probe card holder exchange unit 31. The lower imaging unit 35 picks up images of the probe needles 9a formed on the probe card 9. The lower imaging unit 35 and the needle tip polishing unit 37 are fixed to the stage 7 and move in the X, Y and Z directions together with the stage 7. The detailed configuration of the lower imaging unit 35 will be described later.

(Alignment Unit)

In the main body 1, an alignment unit 41 is arranged above the stage 7. The alignment unit 41 is movable in the Y direction shown in FIG. 2 by a driving unit (not shown). The alignment unit 41 has a horizontal bottom surface facing the stage 7 and the lower imaging unit 35.

(Upper Imaging Unit)

An upper imaging unit 43 is provided at the alignment unit 41. The upper imaging unit 43 picks up images of the electrodes of the device formed on the wafer W that is mounted on the stage 7. The detailed configuration of the upper imaging unit 43 will be described later.

By the above configuration, in the probe apparatus 100, the lower imaging unit 35 and the upper imaging unit 43 are relatively movable to plural positions including, e.g., a position at which they are opposite to each other, a position where the lower imaging unit 35 is opposite to the probe card 9, a position where the upper imaging unit 43 is opposite to the stage 7, and the like.

(Detailed Configuration of the Imaging Units)

Figure 3:
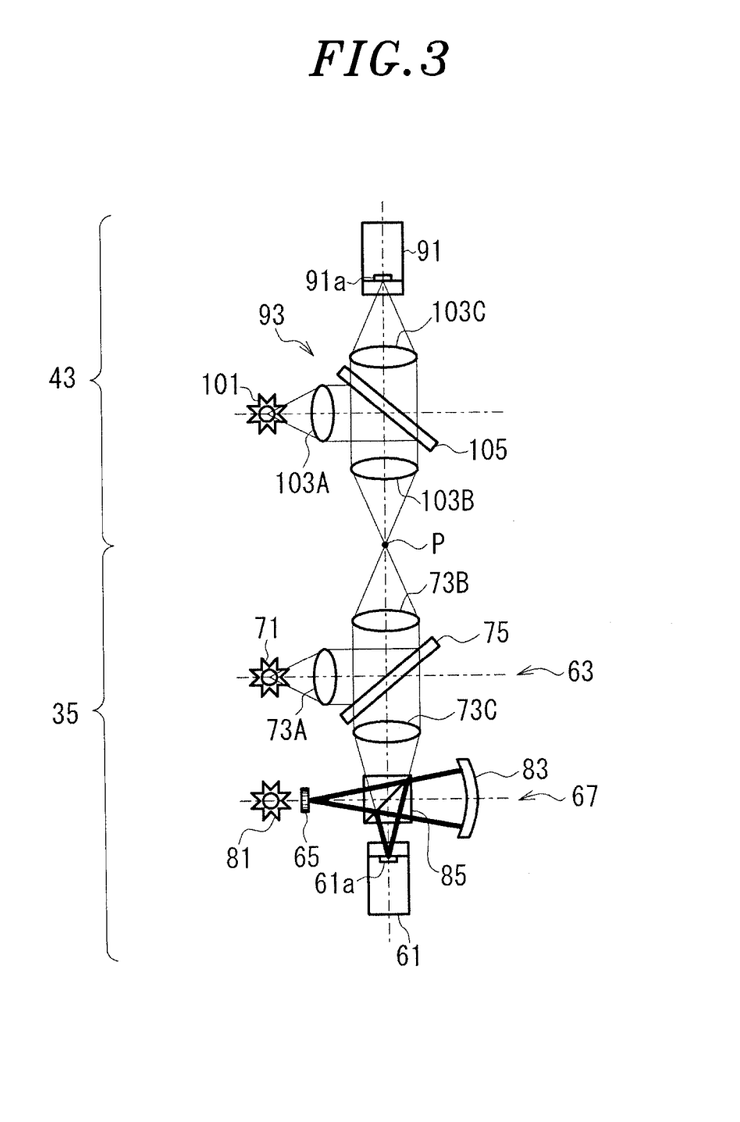
FIG. 3 is an explanatory view showing optical configurations of a lower imaging unit and an upper imaging unit.

Next, the detailed configurations of the lower imaging unit 35 and the upper imaging unit 43 will be described with reference to FIG. 3. FIG. 3 mainly shows optical characteristics of the configurations of the lower imaging unit 35 and the upper imaging unit 43 in a state where they are arranged vertically opposite to each other.

(Lower Imaging Unit)

The lower imaging unit 35 includes: a lower camera 61 serving as a first imaging device; a lower imaging optical unit 63 for picking up images of the probe needles 9a of the probe card 9 by using the lower camera 61; a target 65 from which an optical target mark is generated; and a projection optical unit 67 for projecting the target mark to an image forming unit 61a of the lower camera 61 and an image forming unit 91a of an upper camera 91 at the same time. Herein, the "image forming unit" of the lower camera 61 and the upper camera 91 means an imaging element such as CCD (charge-coupled device), CMOS (complementary metal-oxide semiconductor) or the like in the lower camera 61 and the upper camera 91.

(Lower Camera)

The lower camera 61 picks up images of the probe needles 91 formed on the probe card 9 and generates image data of the images. Further, the lower camera 61 generates image data of the target mark.

(Lower Imaging Optical Unit)

The lower imaging optical unit 63 includes a photographing light source 71 such as a LED lamp or the like, lenses 73A, 73B and 73C for focusing an irradiated light from the photographing light source 71 or a reflected light thereof, and a beam splitter 75 for splitting an irradiated light from the photographing light source 71 or a reflected light thereof. The beam splitter 75 may be, e.g., a half mirror.

(Target)

The target 65 is a thin plate that is made of, e.g., acryl, glass, aluminum, iron or the like and has a thickness of about 50 to 1000 μm. A pattern corresponding to the optical target mark is formed on the target 65. In the present embodiment, the pattern corresponding to the target mark is formed by a through hole provided in the thin plate constituting the target 65. However, instead of the through hole, the pattern corresponding to the target mark may be formed on one surface of, e.g., a transparent acryl plate, glass plate or the like by a method such as deposition, coating or the like. The pattern corresponding to the target mark is optional and may be a geometric pattern, e.g., a circle, quadrangle, cross, concentric ⌈circle⌉ circle, radiation pattern or the like.

(Projection Optical Unit)

The projection optical unit 67 is an optical system for generating the optical target mark, which is an image of the target 65, from the target 65 and projecting the target mark simultaneously to each of the image forming units 61a and 91a of the lower and upper cameras 61 and 91. In FIG. 3, a luminous flux when the target mark is projected on the image forming unit 61a of the lower camera 61 is schematically indicated by bold lines, and a luminous flux when an image is picked up by the lower and upper cameras 61 and 91 and a luminous flux when the target mark is projected on the image forming unit 91a of the upper camera 91 are schematically indicated by fine lines. The projection optical unit 67 includes a projection light source 81 such as a LED lamp or the like, a concave reflecting mirror 83 for reflecting and focusing a light from the projection light source 81, and a beam splitter 85 for splitting the light from the projection light source 81. The beam splitter 85 may be, e.g., a half mirror. The concave reflecting mirror 83 serves as a focusing unit which focuses light toward the image forming unit 61a of the lower camera 61 and also serves as a reflecting unit which reflects light. For this reason, by using the concave reflecting mirror 83, a configuration of the projection optical unit 67 is simplified, a space therefor is saved, and miniaturization thereof is achieved. The concave reflecting mirror 83 may be substituted with a combination of a planar reflecting mirror and a lens.

(Upper Imaging Unit)

The upper imaging unit 43 includes the upper camera 91 serving as a second imaging device, an upper imaging optical unit 93 for picking up an image of the device on the wafer W by using the upper camera 91.

(Upper Camera)

The upper camera 91 picks up images of the electrodes of the device formed on a surface of the wafer W and generates image data of the images. Further, the upper camera 91 generates image data of the target mark.

(Upper Imaging Optical Unit)

The upper imaging optical unit 93 includes a photographing light source 101 such as a LED lamp or the like, lenses 103A, 103B and 103C for focusing an irradiated light from the photographing light source 101 or a reflected light thereof, and a beam splitter 105 for splitting an irradiated light from the photographing light source 101 or a reflected light thereof. The beam splitter 105 may be, e.g., a half mirror.

(Image Forming Position)

An image forming position P of the target mark is formed between the lower imaging optical unit 63 and the upper imaging optical unit 93. In the probe apparatus 100 of the present embodiment, the target 65, the image forming position P of the target mark, and the image forming unit 61a of the lower camera 61 are arranged to be optically conjugate with each other.

Further, in a state shown in FIG. 3, the lower imaging optical unit 63 and the upper imaging optical unit 93 are arranged such that the image forming position P of the target mark and the image forming unit 91a of the upper camera 91 are optically conjugate with each other. That is, in a state shown in FIG. 3, the lower imaging optical unit 63 and the upper imaging optical unit 93 are arranged such that the image forming position P of the target mark, the target 65, the image forming unit 61a of the lower camera 61, and the image forming unit 91a of the upper camera 91 are optically conjugate with each other.

In the lower imaging unit 35, light irradiated from the photographing light source 71 is focused by the lens 73A, and a part of the focused light is reflected on the beam splitter 75, focused by the lens 73B and irradiated to the image forming position P. A part of light reflected on a surface of an object (e.g., the probe needles 9a) placed at the image forming position P is transmitted through the beam splitter 75, focused by the lens 73C, and projected on the image forming unit 61a of the lower camera 61.

In the upper imaging unit 43, light irradiated from the photographing light source 101 is focused by the lens 103A, and a part of the focused light is reflected on the beam splitter 105, focused by the lens 103B and irradiated to an object (e.g., the electrodes of the device) placed under the lens 103B. A part of light reflected on a surface of the object is transmitted through the beam splitter 105, focused by the lens 103C, and projected on the image forming unit 91a of the upper camera 91.

As shown in FIG. 3, when the image forming unit 91a of the upper camera 91 and the image forming position P are arranged at optically conjugate positions, the upper camera 91 is focused on the image forming position P. Therefore, when an object (e.g., the electrodes of the device) is placed at the image forming position P, an image of the object and an image formed at the image forming position P (e.g., the target mark that is an image of the target 65) are exactly projected on the image forming unit 91a of the upper camera 91.

In the projection optical unit 67 of the lower imaging unit 35, light irradiated from the projection light source passes through the target 65 to generate the optical target mark. Further, a part of the light irradiated from the projection light source 81 is transmitted through the beam splitter 85, reflected and focused by the concave reflecting mirror 83, and reflected on the beam splitter 85 to be incident to the lower camera 61. Accordingly, the target mark generated from the target 65 is projected on the image forming unit 61a of the lower camera 61 by the light irradiated from the projection light source 81.

A part of the light irradiated from the projection light source 81 is reflected on the beam splitter 85 and irradiated to the image forming position P through the lens 73C, the beam splitter 75 and the lens 73B. Accordingly, the target mark generated from the target 65 is projected on the image forming position P by the light irradiated from the projection light source 81.

As described above, in a state shown in FIG. 3, the image forming position P of the target mark, the target 65, the lower camera 61 and the upper camera 91 are arranged to be optically conjugate with each other. Accordingly, by forming an image of the target mark on the image forming position P by turning on the projection light source 81, the target mark can be projected to both of the image forming units 61a and 91a of the lower and upper cameras 61 and 91 at the same time.

(Modified Examples of the Projection Optical Unit)

Figure 4:
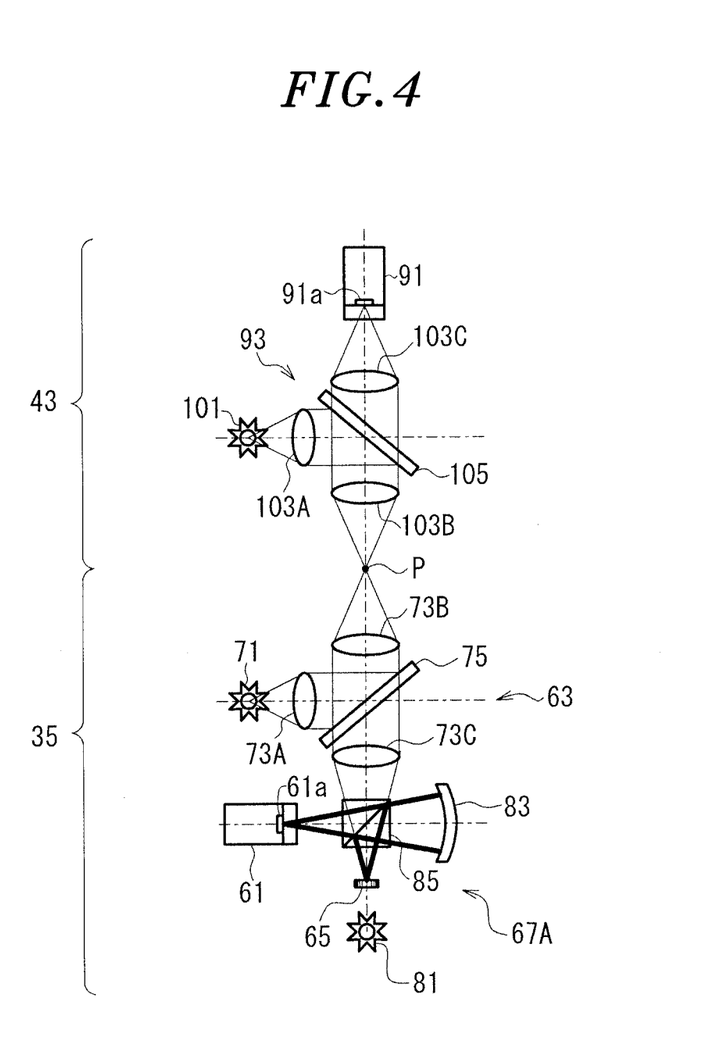
FIG. 4 is an explanatory view showing a modified example of a projection optical unit.
Figure 5:
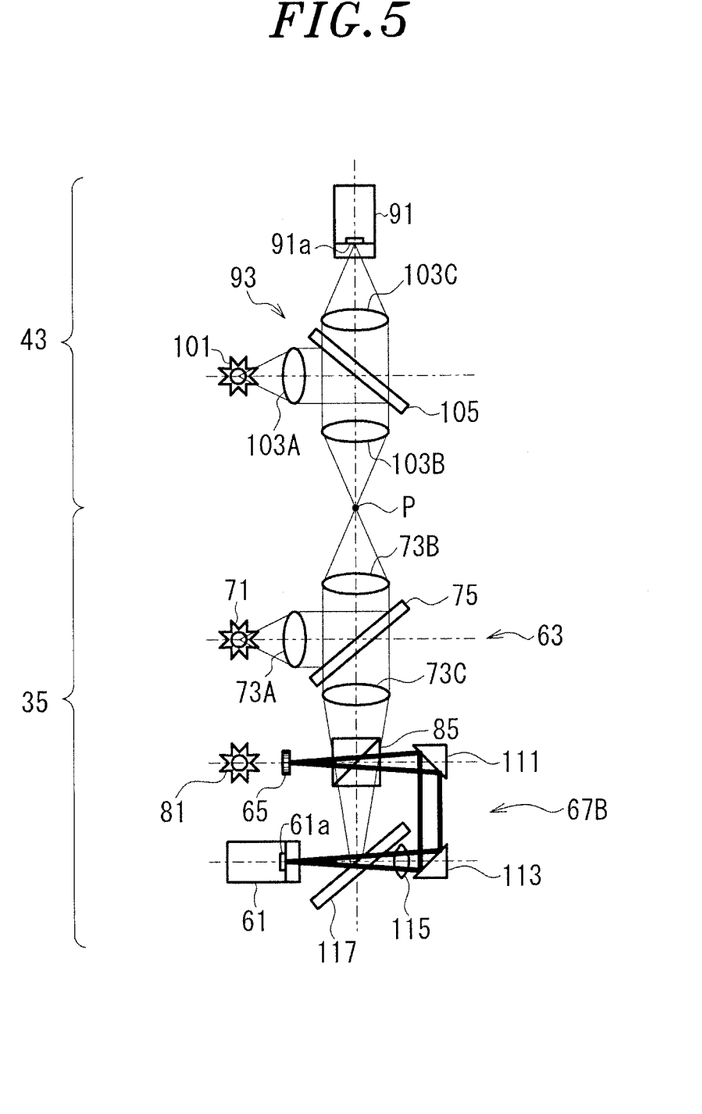
FIG. 5 is an explanatory view showing another modified example of the projection optical unit.
Figure 6:
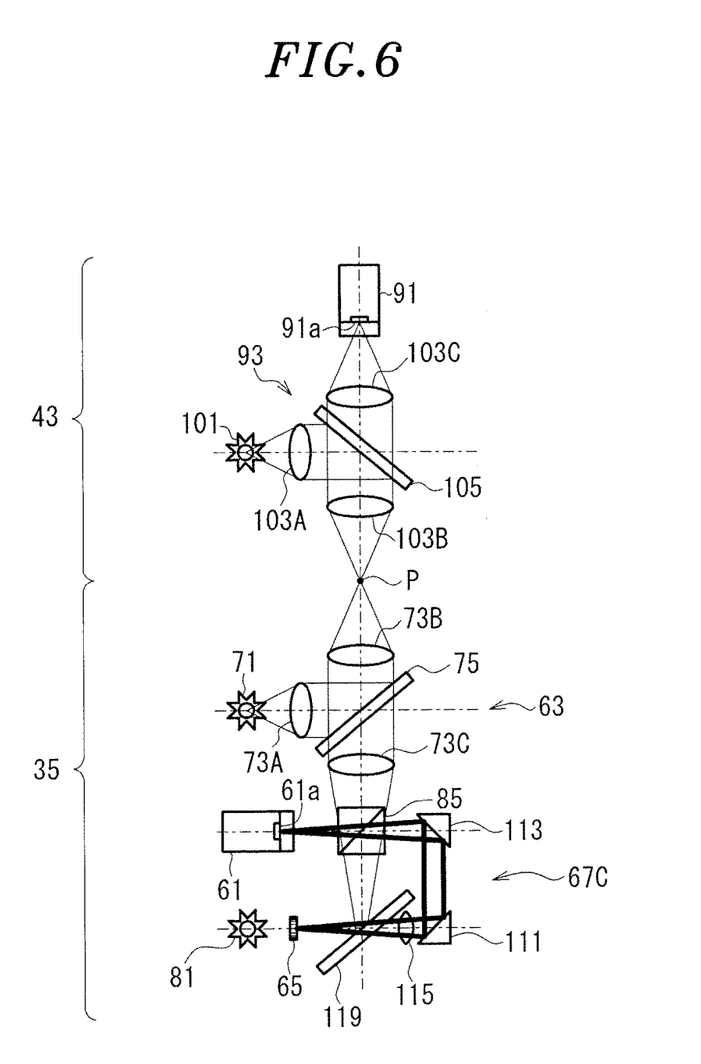
FIG. 6 is an explanatory view showing still another modified example of the projection optical unit.

Next, modified examples of the projection optical unit in the probe apparatus 100 will be described. FIGS. 4 to 6 show modified examples of the projection optical unit. The projection optical unit may have various forms as long as the target mark can be projected on the image forming units 61a and 91a of the lower and upper cameras 61 and 91 at the same time. Herein, three modified examples are representatively described. In FIGS. 4 to 6, the configurations of the upper imaging unit 43, the lower camera 61 and the lower imaging optical unit 63 are the same as those in FIG. 3, and thus like reference numerals are used and redundant description thereof will be omitted. In FIGS. 4 to 6, a luminous flux when the target mark is projected on the image forming unit 61a of the lower camera 61 is schematically indicated by bold lines, and a luminous flux when an image is picked up by the lower and upper cameras 61 and 91 and a luminous flux when the target mark is projected on the image forming unit 91a of the upper camera 91 are schematically indicated by fine lines.

First Modified Example

FIG. 4 shows a first modified example. A projection optical unit 67A of the first modified example includes a projection light source 81 such as a LED lamp or the like, a concave reflecting mirror 83 for focusing light from the projection light source 81, and a beam splitter 85 for splitting the light from the projection light source 81.

In the projection optical unit 67A of the first modified example, the arrangement of the concave reflecting mirror 83 with respect to the lower camera 61, the projection light source 81 and the target 65 is different from that in the projection optical unit 67 shown in FIG. 3. Specifically, in the projection optical unit 67 shown in FIG. 3, the concave reflecting mirror 83 is arranged on an optical axis of a luminous flux from the projection light source 81 that passes through the target 65 and penetrates through the beam splitter 85. In contrast, in the projection optical unit 67A of the first modified example, the concave reflecting mirror 83 is arranged on an optical axis of a luminous flux from the projection light source 81 that passes through the target 65 and is reflected on the beam splitter 85.

In the projection optical unit 67A of the first modified example, the light irradiated from the projection light source 81 generates the optical target mark by passing through the target 65. A part of the light having passed through the target 65 is reflected on the beam splitter 85, reflected and focused by the concave reflecting mirror 83, and transmitted through the beam splitter 85 to be incident to the lower camera 61. Accordingly, the target mark generated from the target 65 is projected on the image forming unit 61a of the lower camera 61 by the light irradiated from the projection light source 81.

Further, in the projection optical unit 67A of the first modified example, a part of the light irradiated from the projection light source 81 is transmitted through the beam splitter 85 and irradiated to the image forming position P through the lens 73C, the beam splitter 75 and the lens 73B. Accordingly, the target mark generated from the target 65 is projected on the image forming position P by the light irradiated from the projection light source 81.

In the first modified example, when an object is placed at the image forming position P, light reflected on a surface of the object passes through the lens 73B, the beam splitter 75 and the lens 73C and a part of the light is reflected on the beam splitter 85 and incident to the lower camera 61.

Second Modified Example

FIG. 5 shows a second modified example. A projection optical unit 67B of the second modified example includes: a projection light source 81 such as LED lamp or the like; a pair of planar reflecting mirrors 111 and 113 for reflecting light from the projection light source 81; a lens 115 for focusing the light from the projection light source 81; a beam splitter 85 for splitting the light from the projection light source 81; and a beam splitter 117 for perpendicularly bending an optical axis between the image forming position P and the lower camera 61.

In the projection optical unit 67B of the second modified example, the light irradiated from the projection light source 81 generates the optical target mark by passing through the target 65. A part of the light having passed through the target 65 is transmitted through the beam splitter 85, reflected sequentially by the planar reflecting mirrors 111 and 113, focused by the lens 115, and transmitted through the beam splitter 117 to be incident to the lower camera 61. Accordingly, the target mark generated from the target 65 is projected on the image forming unit 61a of the lower camera 61 by the light irradiated from the projection light source 81.

Further, in the projection optical unit 67B of the second modified example, a part of the light irradiated from the projection light source 81 is reflected by the beam splitter 85 and irradiated to the image forming position P through the lens 73C, the beam splitter 75 and the lens 73B. Accordingly, the target mark generated from the target 65 is projected on the image forming position P by the light irradiated from the projection light source 81.

In the second modified example, when an object is placed at the image forming position P, light reflected by a surface of the object passes through the lens 73B, the beam splitter 75, the lens 73C and the beam splitter 85 and a part of the light is reflected by the beam splitter 117 and incident to the lower camera 61.

Third Modified Example

FIG. 6 shows a third modified example. A projection optical unit 67C of the third modified example includes: a projection light source 81 such as a LED lamp or the like; a pair of planar reflecting mirrors 111 and 113 for reflecting light from the projection light source 81; a lens 115 for focusing the light from the projection light source 81; a beam splitter 85 for splitting the light from the projection light source 81; and a beam splitter 119 for perpendicularly bending an optical axis between the projection light source 81 and the image forming position P.

In the projection optical unit 67C of the third modified example, the light irradiated from the projection light source 81 generates the optical target mark by passing through the target 65. A part of the light having passed through the target 65 is transmitted through the beam splitter 119, focused in the lens 115, reflected sequentially by the planar reflecting mirrors 111 and 113, and transmitted through the beam splitter 85 to be incident to the lower camera 61. Accordingly, the target mark generated from the target 65 is projected on the image forming unit 61a of the lower camera 61 by the light irradiated from the projection light source 81.

Further, in the projection optical unit 67C of the third modified example, a part of the light irradiated from the projection light source 81 is reflected by the beam splitter 119, transmitted through the beam splitter 85, and irradiated to the image forming position P through the lens 73C, the beam splitter 75 and the lens 73B. Accordingly, the target mark generated from the target 65 is projected on the image forming position P by the light irradiated from the projection light source 81.

In the third modified example, when an object is placed at the image forming position P, light reflected by a surface of the object passes through the lens 73B, the beam splitter 75 and the lens 73C, and a part of the light is reflected by the beam splitter 85 and incident to the lower camera 61.

In the probe apparatus 100 of the present embodiment, the projection optical unit is not limited to the above three modified examples but may be variously modified as long as the target mark can be projected on the image forming units 61a and 91a of the lower and upper cameras 61 and 91 at the same time.

(Controller)

Figure 7:
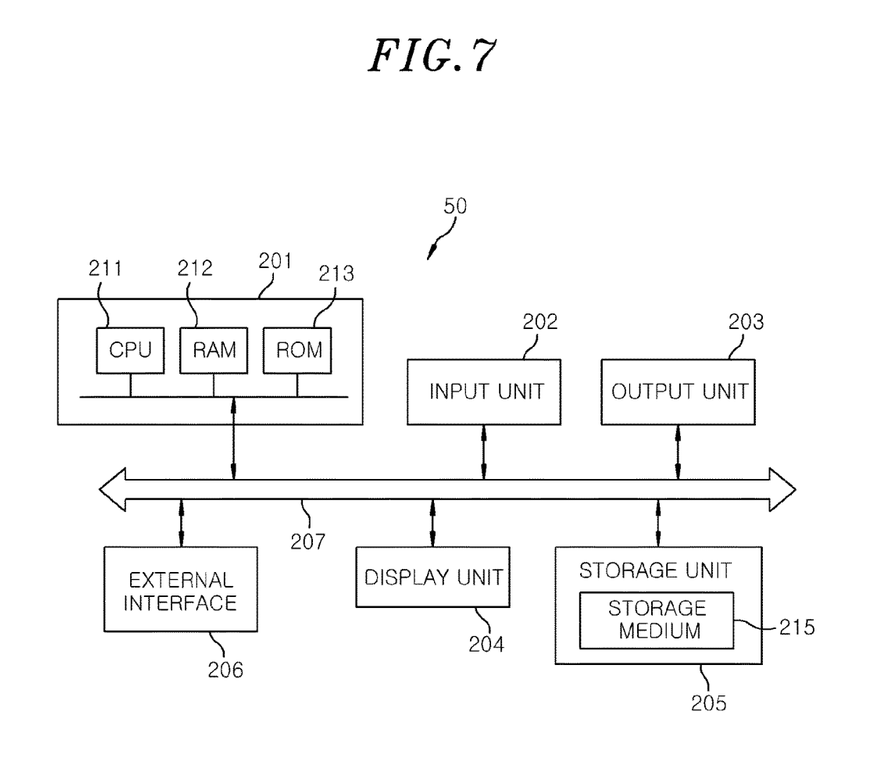
FIG. 7 is an explanatory view showing an example of a hardware configuration of a control unit.

The probe apparatus 100 further includes a controller 50. The controller 50 controls the operations of respective components of the probe apparatus 100. The controller 50 is typically a computer. FIG. 7 shows an example of a hardware configuration of the controller 50. The controller 50 includes: a main control unit 201; an input unit 202 such as a keyboard, a mouse and the like; an output unit 203 such as printer and the like; a display unit 204; a storage unit 205; an external interface 206; and a bus 207 which connects them to each other. The main control unit 201 has a CPU (central processing unit) 211, RAM (random-access memory) 212 and ROM (read-only memory) 213. The storage unit 205 may be any type as long as it can store information, but may be, e.g., a hard disk device or an optical disk device. The storage unit 205 stores information to a computer-readable storage medium 215 and reads out the information from the storage medium 215. The storage medium 215 may be any type as long as it can store information, but may be, e.g., a hard disk, an optical disk, a flash memory or the like. The storage medium 215 may store recipes of a probe method performed in the probe apparatus 100 of the present embodiment.

In the probe apparatus 100 of the present embodiment, the controller 50 controls, with respect to a plurality of wafers W, a test on the devices formed on the wafers W. Specifically, the controller 50 controls the respective components (e.g., a driving device such as the motor 23b and the like, a position detecting device such as the encoder 23c and the like, the lower imaging unit 35, the upper imaging unit 43, and the like) in the probe apparatus 100. The CPU 211 uses the RAM 212 as a working area and executes a software (program) stored in the ROM 213 or the storage unit 205, thereby realizing the control.

(Probe Method)

Next, an example of a probe method for performing the electrical characteristic test of a device formed on the wafer W by using the probe apparatus 100 will be described with reference to FIGS. 8 to 11. FIGS. 8 to 11 are explanatory views for explaining processes of the probe method of the present embodiment. FIGS. 8 to 11 schematically show position relationships between the stage 7, the lower imaging unit 35, the upper imaging unit 43, the probe 9 (the probe needles 9*a*) and the wafer W (the device, whose illustration is omitted). In FIGS. 8 to 11, reference numeral 301 schematically indicates a luminous flux between the image forming unit 61*a* of the lower camera 61 and the image forming position P, or a luminous flux between the image forming unit 61*a* and an object (the probe needles 9*a*), and reference numeral 303 schematically indicates a luminous flux between the image forming unit 91*a* of the upper camera and the image forming position P, or a luminous flux between the image forming unit 91*a* and an object (the electrode of the device).

The probe method of the present embodiment may be performed identically to the probe methods in the conventional probe apparatuses, except that the probe method of the present embodiment uses the optical target mark instead of a mechanical target mark and projects the target mark to each of the image forming units 61*a* and 91*a* of the lower and upper cameras 61 and 91 at the same time. For example, the probe method of the present embodiment may include the following processes A to D.

First, as a preparatory step, a wafer W that is a substrate to be tested is taken out from a FOUP (not shown) of the loader unit 3 and transferred to the stage 7. Although not shown, a device that is a measuring target is formed on a surface of the wafer W.

(Process A)

Figure 8:
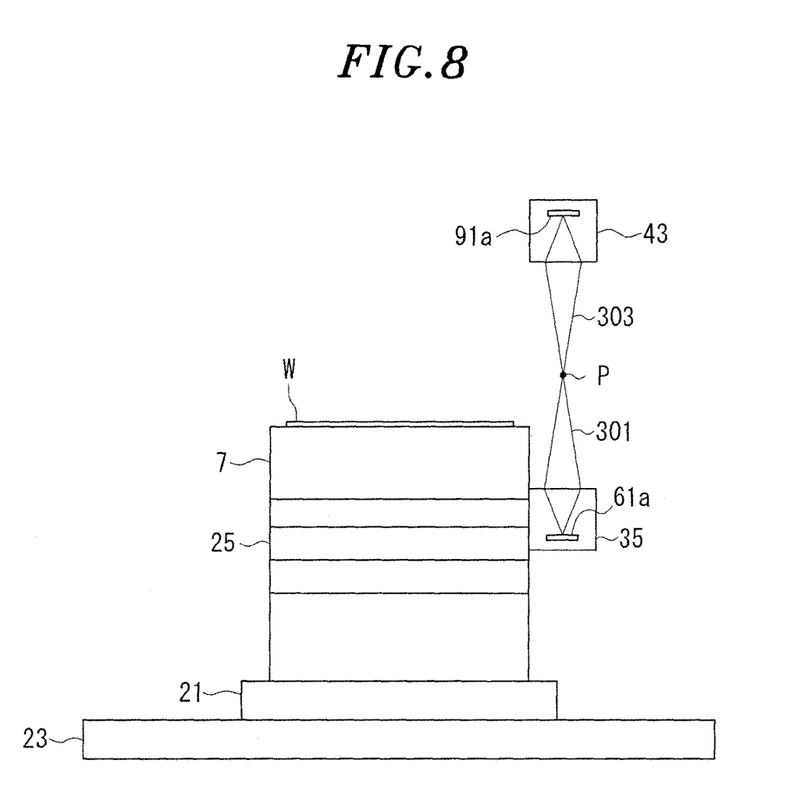
FIG. 8 is an explanatory view of a process in a probe method in accordance with an embodiment.

In the process A, the target mark is projected on the image forming unit 61*a* of the lower camera 61 and the image forming unit 91*a* of the upper camera 91 at the same time, and a position alignment of the lower camera 61 and the upper camera 91 is performed based on the image data of the target mark. As shown in FIG. 8, the lower imaging unit 35 and the upper imaging unit 43 are relatively moved to a position at which they are vertically opposite to each other. Next, the projection light source 81 of the projection optical unit 67 of the lower imaging unit 35 is turned on and the target mark generated from the target 65 is projected on the imaging forming position P. As a result, the target mark is projected on the image forming units 61*a* and 91*a* of the lower and upper cameras 61 and 91 at the same time. Thereafter, based on each image data of the target mark obtained by the lower and upper cameras 61 and 91, a position alignment is performed such that the image forming unit 91*a* of the upper camera 91 and the image forming position P are optically conjugate with each other. Specifically, a position is obtained such that the centers of the target marks simultaneously projected on the image forming units 61*a* and 91*a* of the lower and upper cameras 61 and 91 coincide with the optical axes of the lower and upper cameras 61 and 91, and a focus of the upper camera 61 coincides with the image forming position P.

The position alignment is performed by moving the lower imaging unit 35 fixed to the stage 7 in the X, Y and Z directions while comparing the image data of the target mark obtained by the lower camera 61 with the image data of the target mark obtained by the upper camera 91. Since the image forming unit 61*a* of the lower camera 61 is in an optically conjugate position relationship with the target 65 and the image forming position P from the beginning, the lower camera 61 and the upper camera 91 coincide with each other in their focuses and optical axes. At this time, X, Y and Z coordinates of the stage 7 is stored as, e.g., (X0, Y0, Z0) in the RAM 212, the storage unit 205, or the storage medium 215 of the controller 50.

In the probe method of the present embodiment, in the process A, the positions of the lower camera 61 and the upper camera 91 are aligned in X, Y and Z directions by a single position alignment by projecting the target mark onto the image forming unit 61*a* of the lower camera 61 and the image forming unit 91*a* of the upper camera 91 at the same time. Accordingly, compared to a case where a real image of the target 65 is obtained individually by two cameras, the time required for the position alignment is reduced and a mechanism and effort for inserting an opaque plate or the like for marking the real image on the image forming position P is not needed.

(Process B)

Figure 9:
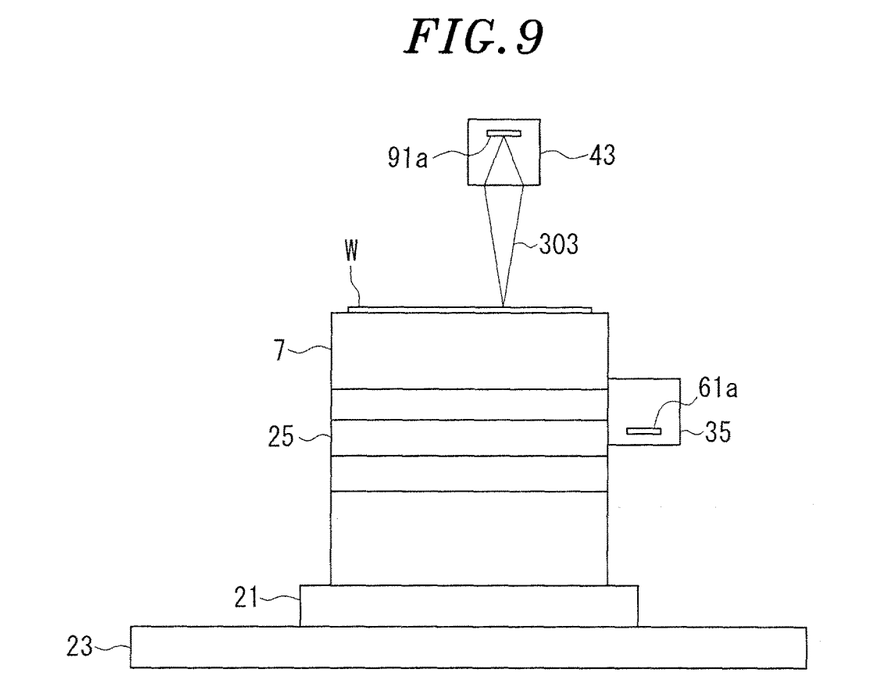
FIG. 9 is an explanatory view of another process in the probe method.

In the process B, images of a plurality of electrodes of the device on the wafer W are picked up by the upper camera 91, and the position coordinates of the electrodes at that time are stored. In a state where the projection light source 81 is turned off, as shown in FIG. 9, the stage 7 is relatively moved to under the upper imaging unit 43. Then, the photographing light source 101 is turned on and images are picked up in a state where the upper camera 91 is focused on predetermined image pickup points (e.g., five image pickup points) on the wafer W. Herein, the image pickup points are set to predetermined electrodes of the device formed on the wafer W. From the obtained image data, the position coordinates of each image pickup point at that time are obtained. Here, for the sake of convenience, the position coordinates of each image pickup point are collectively expressed as (X1, Y1, Z1). The position coordinates (X1, Y1, Z1) are stored in the RAM 212, the storage unit 205, or the storage medium 215 of the controller 50.

In the above description, a position alignment in the θ direction (circumferential direction) of the stage 7 is not considered. However, if considering the deviation between an arrangement direction of the probe needles 9*a* and an arrangement direction of the device, the deviation in the θ direction is obtained from any two points of the image pickup points and a correction is performed by moving the stage 7 along the θ direction.

(Process C)

Figure 10:
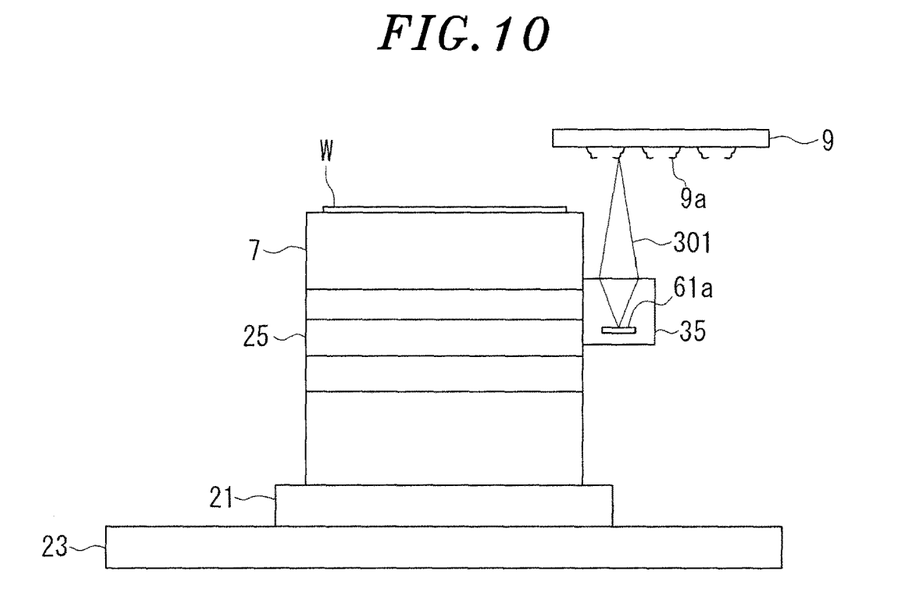
FIG. 10 is an explanatory view of a still another process in the probe method.

In the process C, images of the probe needles 9*a* of the probe card 9 are picked up by the lower camera 61, and the position coordinates of the probe needles 9*a* at that time are stored. In a state where the projection light source 81 is turned off, as shown in FIG. 10, the lower camera 61 of the lower imaging unit 35 is relatively moved to under the probe needles 9*a*. The photographing light source 71 is turned on. The lower imaging unit 35 fixed to the stage 7 is moved in the X, Y and Z directions such that the lower camera 61 is focused on a predetermined probe needle 9*a*, and then an image is picked up. From the obtained image data, the position coordinates (X2, Y2, Z2) of the probe needle 9*a* at that time are obtained. The position coordinates (X2, Y2, Z2) are stored in the RAM 212, the storage unit 205, or the storage medium 215 of the controller 50.

In the above processes A to C, the positions in the X, Y and Z directions of the lower and the upper camera 61 and 91 are aligned such that the image forming unit 91*a* of the upper camera 91, the image forming position P of the target mark, and the image forming unit 61*a* of the lower camera 61 are optically conjugate with each other in the process A.

Therefore, this is equivalent to a case where images of the wafer W and the probe needles 9a are picked up by a single imaging device. Accordingly, relative positions between the image pickup points on the wafer W and the probe needles 9a can be accurately obtained from the above position coordinates. The above position coordinates may be managed by, e.g., the number of pulses of each encoder in the X, Y and Z directions with respect to a case where the stage 7 is positioned at a predetermined standard location. In the probe method of the present embodiment, the sequence of the processes A to C is not important. For example, the processes may be performed in a sequence of A, B and C, a sequence of A, C and B, a sequence of B, A and C, a sequence of B, C and A, a sequence of C, A and B, or a sequence of C, B and A. The processes A to C may be preferably performed whenever the alignment unit 41 is moved.

(Process D)

Figure 11:
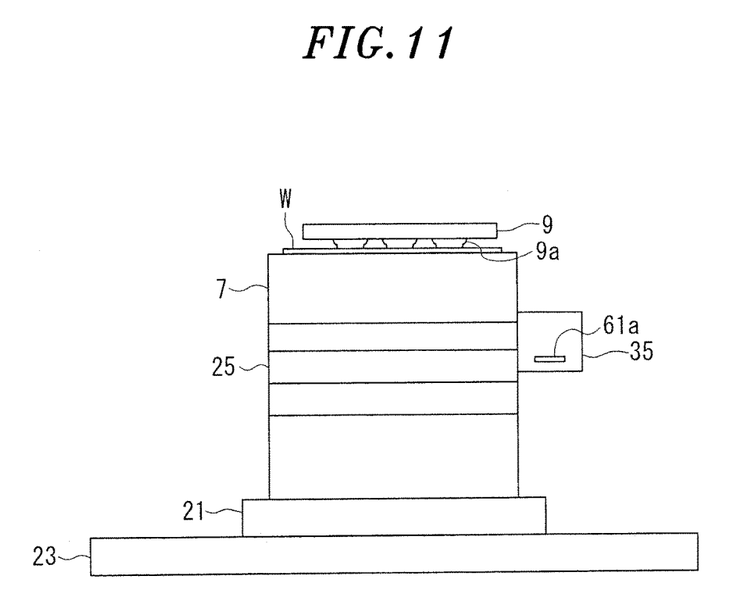
FIG. 11 is an explanatory view of still yet another process in the probe method.

In the process D, as shown in FIG. 11, the stage 7 is moved in the X, Y and Z directions such that the positions of the probe needles 9a are aligned with the positions of the electrodes of a predetermined device formed on the surface of the wafer W based on the position coordinates obtained in each of the processes A to C. Thereafter, the probe needles 9a are made to contact with the electrodes to inspect the electrical characteristic of the device.

As such, the probe apparatus 100 of the present embodiment includes the projection optical unit which projects the optical target mark, used in the position alignment of the lower and upper cameras 61 and 91, onto the image forming unit 61a of the lower camera 61 and the image forming unit 91a of the upper camera 91 at the same time. Therefore, the position alignment of a pair of cameras can be performed in a short period of time by an optical means that occupies a small installation space and has a simple configuration, without using the mechanical target. Further, the positions of the lower and upper cameras 61 and 91 can be aligned in the Z direction as well as in the X and Y directions by a single position alignment. Accordingly, in the probe apparatus 100 of the present embodiment, it is possible to accurately measure the electrical characteristic of the device formed on the wafer W in a short period of time. Further, in the probe apparatus 100 of the present embodiment, it is possible to solve problems, occurring when the mechanical target is used, such as collision due to malfunction, generation of particles, difficulty in miniaturization due to a large number of components, high cost, complexity of regular maintenance, and the like.

Although the embodiment of the present invention has been described as an example in detail, the present invention is not limited to the above embodiment and may be variously modified. For example, the projection optical units 67, 67A, 67B and 67C are provided in the lower imaging unit 35 in the above embodiment, but may be provided in the upper imaging unit 43. Further, a pair of cameras to be position-aligned is not limited to a vertical position relationship. For example, a pair of cameras may be arranged in the horizontal direction, and the present invention may also be applied to this case.

The substrate to be tested is not limited to the semiconductor wafer but may be one for a flat panel display represented as a glass substrate used in a liquid crystal display.

While the invention has been shown and described with respect to the embodiments, it will be understood by those skilled in the art that various changes and modifications may be made without departing from the scope of the invention as defined in the following claims.

What is claimed is:

1. A probe apparatus comprising:
   a stage configured to hold a substrate and to be movable in horizontal and vertical directions;
   a first imaging device configured to capture an image of a probe needle configured to contact with an electrode of a device formed on a surface of the substrate;
   a first imaging optical unit including an optical system configured to perform image capture by using the first imaging device;
   a second imaging device configured to capture an image of the electrode in a state where the substrate is held on the stage;
   a second imaging optical unit including an optical system configured to perform image capture by using the second imaging device;
   a projection optical unit including an optical system configured to project an optical target mark onto each of image forming units of the first and the second imaging device at the same time, wherein the optical target mark is used for position alignment of the first and the second imaging device; and
   a target, wherein the optical target mark is a projected image of the target;
   wherein the projection optical unit is configured to form an image forming position, on which the optical target mark is projected, at an optically conjugate position with respect to the image forming unit of the first imaging device,
   wherein the target, the image forming position, and the image forming unit of the second imaging device are arranged to be optically conjugate with each other, and the optical target mark is projected on each of the image forming units of the first and the second imaging device at the same time, and
   wherein the image forming position of the optical target mark is located between the first imaging optical unit and the second imaging optical unit.

2. The probe apparatus of claim 1, wherein the projection optical unit includes:
   a projection light source configured to irradiate light to the target;
   a splitter configured to split the light having passed through the target from the projection light source; and
   a focusing unit configured to focus the light split by the splitter to cause the optical target mark to be formed on the image forming unit of the first imaging device.

3. The probe apparatus of claim 2, wherein the focusing unit comprises a concave reflecting mirror.

4. The probe apparatus of claim 1, wherein the target is disposed outside of a space between the first imaging optical unit and the second imaging optical unit.

5. A probe method by using a probe apparatus comprising:
   disposing a substrate on a movable stage;
   using a first imaging device to capture an image of a probe needle configured to contact with an electrode of a device formed on a surface of the substrate;
   using a second imaging device to capture an image of the electrode in a state where the substrate is disposed on the stage;
   projecting an optical target mark onto each of image forming units of the first and the second imaging device at a same time, wherein the optical target mark is used for position alignment of the first and the second imaging device, wherein the optical target mark is a projected image of a target; and forming an image forming position, on which the optical target mark is projected, at an optically conjugate position with respect to an image forming unit of the first imaging device, wherein the target, the image forming position, and the image forming unit of the second imaging device are arranged to be optically conjugate with each other, and wherein the image forming position of the optical target mark is located between a first imaging optical unit of the first imaging device and the second imaging optical unit of the second imaging device.

* * * * *